United States Patent
Kim et al.

(10) Patent No.: US 7,190,587 B2
(45) Date of Patent: Mar. 13, 2007

(54) FANLESS HIGH-EFFICIENCY COOLING DEVICE USING ION WIND

(75) Inventors: Joong El Kim, Kyungki-do (KR); Alexander T. Kynin, Kyungki-do (KR); Jung Kyu Park, Seoul (KR); Si Young Yang, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 289 days.

(21) Appl. No.: 10/995,508

(22) Filed: Nov. 24, 2004

(65) Prior Publication Data
US 2006/0061967 A1   Mar. 23, 2006

(30) Foreign Application Priority Data
Sep. 22, 2004   (KR)   ...................... 10-2004-0075844

(51) Int. Cl.
H05K 7/20 (2006.01)
H01J 17/28 (2006.01)
F28F 13/16 (2006.01)

(52) U.S. Cl. ........................ 361/704; 165/80.3; 165/96; 165/185; 361/690; 361/703; 361/710; 313/582

(58) Field of Classification Search ...................... None
See application file for complete search history.

(56) References Cited

U.S. PATENT DOCUMENTS 3,187,087 A * 6/1965 Katz et al. ................. 174/70 R
3,212,275 A * 10/1965 Tillman, Jr. ................. 136/204
5,990,618 A * 11/1999 Morita et al. ................ 313/582
5,993,027 A * 11/1999 Yamamoto et al. .......... 362/294
7,072,179 B1 * 7/2006 Curran et al. ................ 361/687
7,096,450 B2 * 8/2006 Gill et al. ...................... 716/15

OTHER PUBLICATIONS

WO 94/12282, Yechiel Spector "Cooling Method and Apparatus" Jun. 9, 1194.*

* cited by examiner

Primary Examiner—Greg Thompson
(74) Attorney, Agent, or Firm—Lowe Hauptman & Berner, LLP.

(57) ABSTRACT

Disclosed herein is a fanless high-efficiency cooling device that is applicable to electronic products having heat sources, such as plasma display panel (PDP) televisions, liquid crystal display (LCD) televisions, and liquid crystal display (LCD) monitors. The fanless high-efficiency cooling device using ion wind comprises a heat sink having a fixing part fixedly attached to a heat-generating part of an electronic product and a plurality of protrusions extending a predetermined height from a bottom surface of the fixing part, a cover that covers the upper part of the heat sink, at least one electric wire for generating ion wind between the corresponding protrusions when high voltage is applied to the electric wire, an electric wire-supporting member that supports both ends of the electric wire, and a power supply that connects a high-voltage terminal to the electric wire and connects a ground terminal to the heat sink to supply high voltage to the electric wire.

11 Claims, 13 Drawing Sheets

FIG. 8c (downward movement of ion wind toward the bottom surface of heat sink)

FIG. 9a (upward movement of ion wind along the bottom surface of heat sink)

FANLESS HIGH-EFFICIENCY COOLING DEVICE USING ION WIND

RELATED APPLICATIONS

The present application is based on, and claims priority from, Korean Application Number 2004-75844, filed Sep. 22, 2004, the disclosure of which is incorporated by reference herein in its entirety.

BACKGROUND OF THE INVENTION

1. Field of the Invention

The present invention relates to a fanless high-efficiency cooling device that is applicable to electronic products having heat sources, such as plasma display panel (PDP) televisions, liquid crystal display (LCD) televisions, and liquid crystal display (LCD) monitors, and more particularly to a fanless high-efficiency cooling device that is capable of noiselessly eliminating heat generated from an electronic product through forced convection of ion wind without using a cooling fan, and increasing the velocity of the ion wind, whereby cooling efficiency of the fanless high-efficiency cooling device is improved.

2. Description of the Related Art

Plasma display panel (PDP) televisions, liquid crystal display (LCD) televisions, and liquid crystal display (LCD) monitors have fluorescent substance emitting-type display units. Such display units are advantageous to realize realistic screens. Also, the display units are not influenced by the magnetic field of the earth. Consequently, the display units provide clear and vivid images anywhere. Furthermore, the display units have advantages in that there is no difference in screen quality between the center part of the screen and the edge part of the screen.

However, driving voltages of such electronic products as described above are very high with the result that power consumption of the electronic products is great. Also, high temperature is generated from heat sources, such as a power supply that supplies power to a heat-generating part, for example, a rear panel, a panel driving circuit, and a light emitting diode (LED) unit. In order to eliminate such high temperature, cooling devices are mounted in the electronic products.

Figure 1:
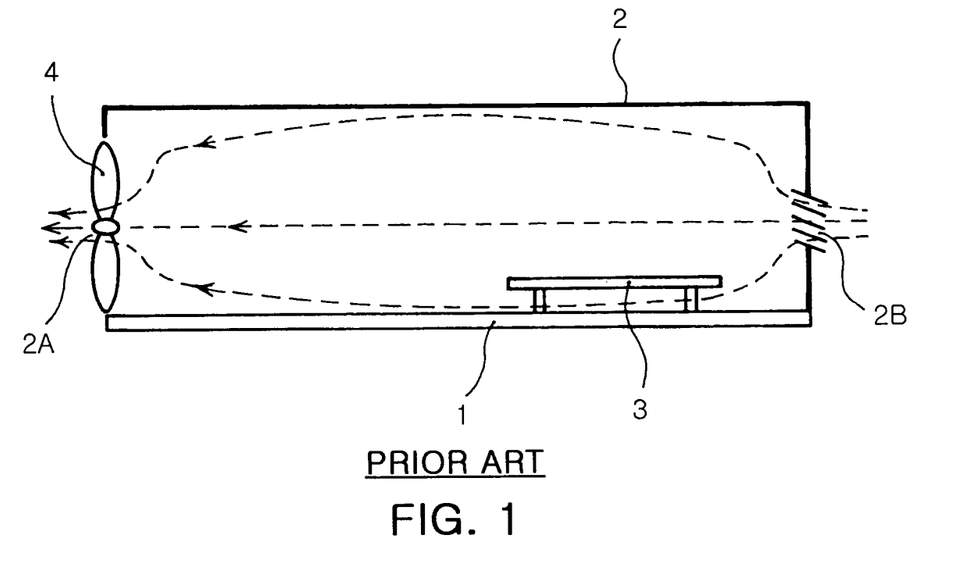
FIG. 1 is a view showing the structure of a conventional fan-type cooling device.
Figure 2:
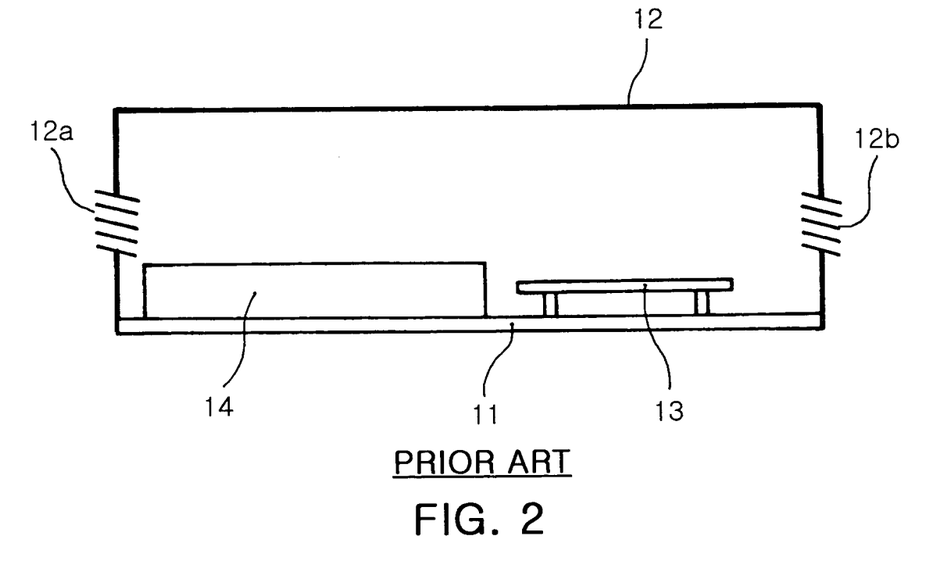
FIG. 2 is a view showing the structure of a conventional fanless-type cooling device.

Examples of such cooling devices are shown in FIGS. 1 and 2.

FIG. 1 is a view showing the structure of a conventional fan-type cooling device.

In an electronic product, to which the conventional fan-type cooling device shown in FIG. 1 is applied, a rear heat-generating part 1 of the electronic product is covered by a rear case 2, and a plurality of heat-source elements 3 are mounted to the rear heat-generating part 1 in the rear case 2.

In order to eliminate heat generated from the plurality of heat-source elements 3 of the electronic product, a cooling fan 4 is disposed at an outlet opening 2A formed at one side of the rear case 2. At the other side of the rear case 2 is formed an inlet opening 2B.

When the cooling fan 4 is operated, forced convection is created in the rear case 2. As a result, external cool air is introduced into the rear case 2 through the inlet opening 2B, and internal hot air is discharged out of the rear case 2 through the outlet opening 2A.

The conventional fan-type cooling device as described above has excellent cooling efficiency. However, the conventional fan-type cooling device has problems in that the cooling fan is vibrated when the cooling fan is operated, and noise is generated by friction between the cooling fan and air.

In order to solve the above-mentioned problems, various efforts have been made. For example, an additional vibration isolating structure may be provided to reduce vibration and noise generated at the position where the cooling fan is mounted. Alternatively, an additional vibration isolating rubber pad may be used to reduce vibration and noise generated from the cooling fan.

In the conventional fan-type cooling device, however, reduction of vibration and noise generated from the cooling fan is limited. As a result, the conventional fan-type cooling device is not applicable to electronic products, such as televisions, that are to be operated noiselessly. For this reason, fanless-type cooling devices have been proposed to effectively solve the problems caused by the conventional fan-type cooling device.

FIG. 2 is a view showing the structure of a conventional fanless-type cooling device.

In an electronic product, to which the conventional fanless-type cooling device shown in FIG. 2 is applied, a rear heat-generating part 11 of the electronic product is covered by a rear case 12, and a plurality of heat-source elements 13 are mounted to the rear heat-generating part 11 in the rear case 12.

In order to eliminate heat generated from the electronic product constructed as described above, an outlet opening 12A is formed at one side of the rear case 12. At the other side of the rear case 12 is formed an inlet opening 12B. On the rear heat-generating part 11 of the electronic product is mounted a heat sink 14 such that heat generated from the heat-generating part 11 is discharged to the air through the heat sink 14.

As described above, the conventional fanless-type cooling device has an advantage in that the cooling device is operated without noise. In the conventional fanless-type cooling device, however, air flows only by natural convection. As a result, cooling efficiency of the conventional fanless-type cooling device is too low, and thus the conventional fanless-type cooling device is not applicable to electronic products that generate high temperature.

As described above, the conventional cooling devices are operated with noise and low efficiency. Consequently, it is increasingly necessary to develop a fanless high-efficiency cooling device.

SUMMARY OF THE INVENTION

Therefore, the present invention has been made in view of the above problems, and it is an object of the present invention to provide a fanless high-efficiency cooling device that is capable of noiselessly eliminating heat generated from an electronic product through forced convection of ion wind without using a cooling fan.

It is another object of the present invention to provide a fanless high-efficiency cooling device that is capable of increasing the velocity of the ion wind, whereby cooling efficiency of the fanless high-efficiency cooling device is improved.

In accordance with the present invention, the above and other objects can be accomplished by the provision of a fanless high-efficiency cooling device using ion wind, the device comprising: a heat sink having a fixing part fixedly attached to a heat-generating part of an electronic product and a plurality of protrusions extending a predetermined height from a bottom surface of the fixing part; a cover that covers the upper part of the heat sink while exposing both ends of the heat sink to define fluid inlet and outlet channels between the protrusions; at least one electric wire, disposed between one of the protrusions and another adjacent protrusion such that the electric wire extends a predetermined length from one end of the heat sink to the other end of the heat sink while being in parallel with the protrusions, for generating ion wind between the corresponding protrusions when high voltage is applied to the electric wire, the electric wire being made of a conductive material; an electric wire-supporting member that supports both ends of the electric wire; and a power supply that connects a high-voltage terminal to the electric wire and connects a ground terminal to the heat sink to supply high voltage to the electric wire.

Preferably, the fanless high-efficiency cooling device according to the present invention further comprises: wind guides formed at both sides of the respective protrusions for accelerating ion wind generated by means of the electric wire toward the bottom surface of the heat sink.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the accompanying drawings.

In the drawings, the same or similar elements are denoted by the same reference numerals even though they are depicted in different drawings.

Figure 3A:
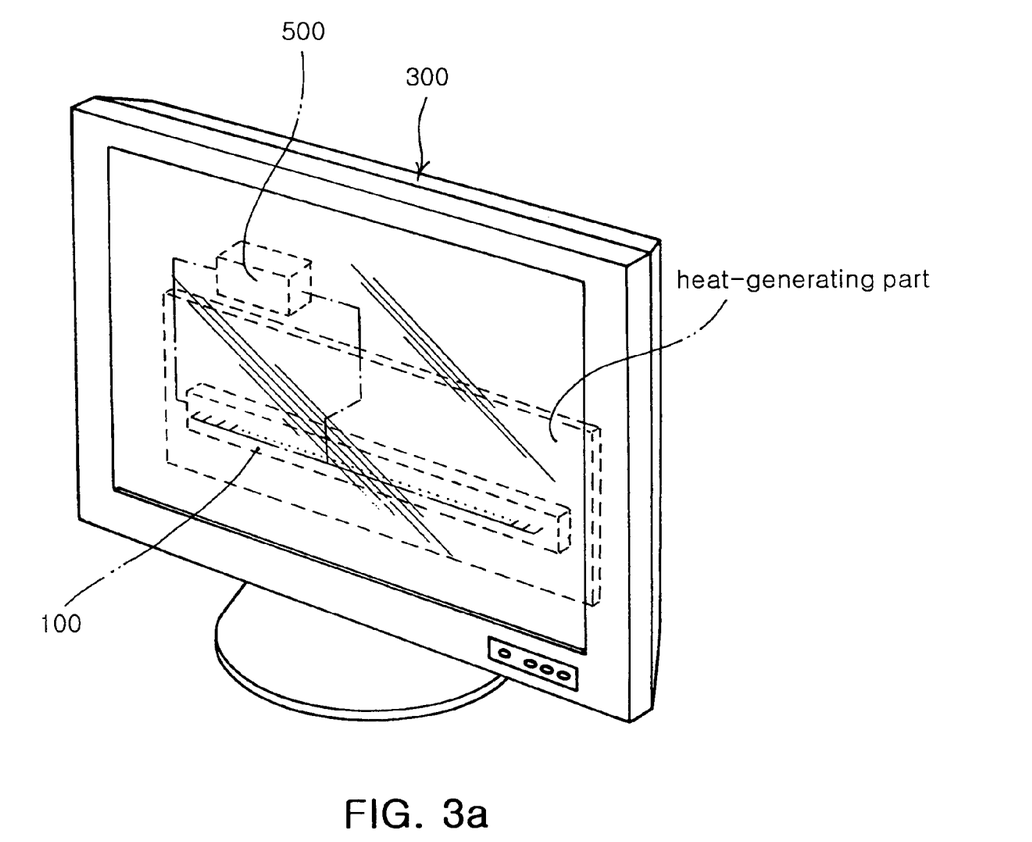
FIG. 3A is a perspective view showing an electronic product with a fanless high-efficiency cooling device according to the present invention mounted therein.
Figure 3B:
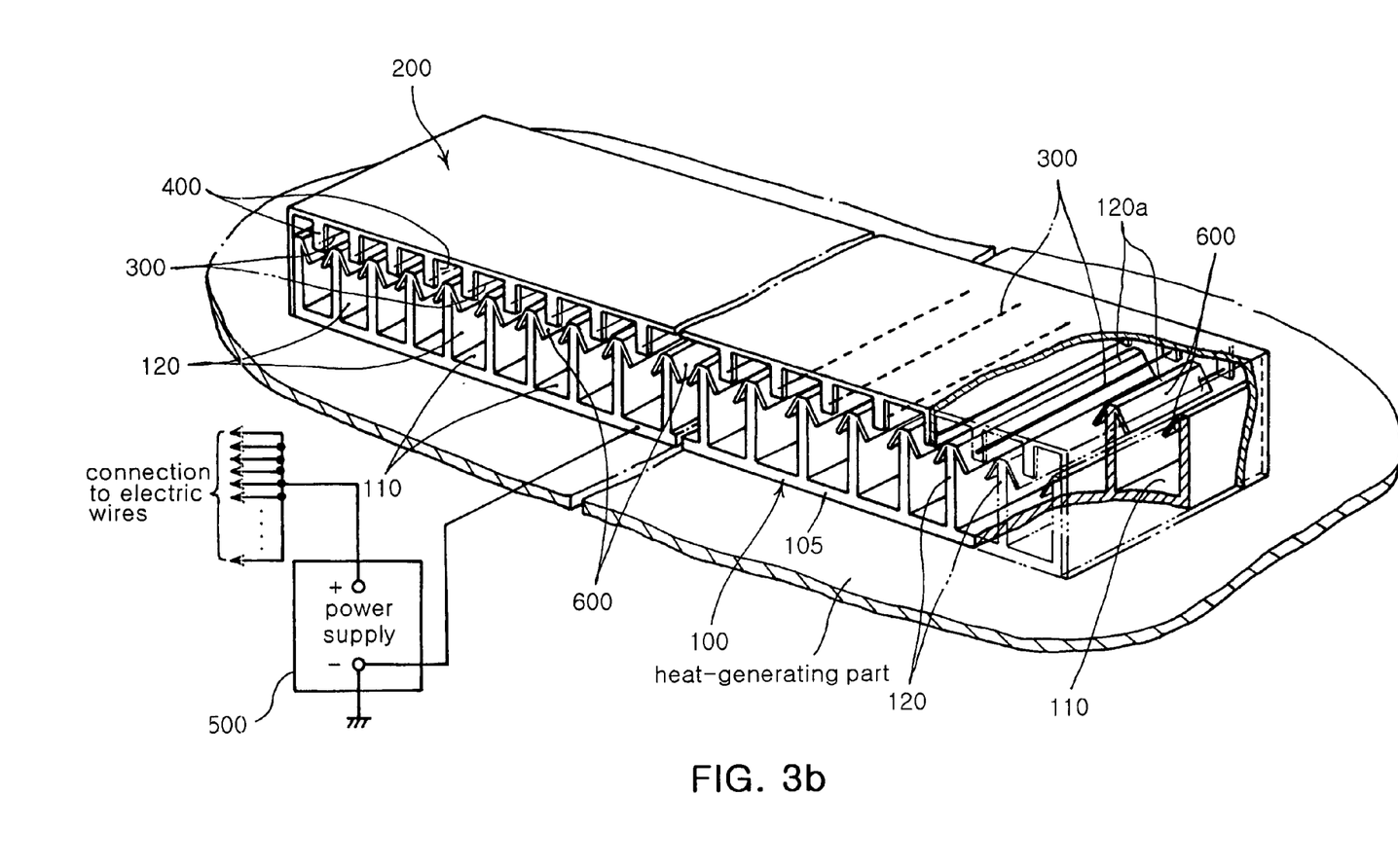
FIG. 3B is a perspective view showing the structure of the fanless high-efficiency cooling device according to the present invention shown in FIG. 3A.
Figure 4:
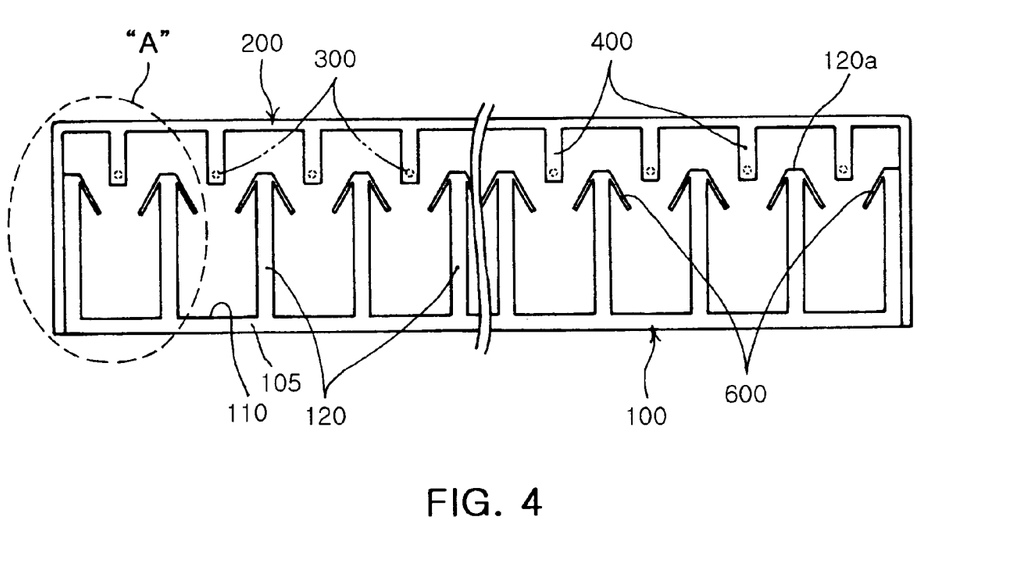
FIG. 4 is a plan view of the fanless high-efficiency cooling device according to the preferred embodiment of the present invention shown in FIG. 3B.

FIG. 3A is a perspective view showing an electronic product with a fanless high-efficiency cooling device according to the present invention mounted therein, and FIG. 3B is a perspective view showing the structure of the fanless high-efficiency cooling device according to the present invention shown in FIG. 3A. FIG. 4 is a plan view of the fanless high-efficiency cooling device according to the preferred embodiment of the present invention shown in FIG. 3B.

Referring to FIGS. 3A, 3B, and 4, the fanless high-efficiency cooling device comprises: a heat sink 100 having a fixing part 105 fixedly attached to a heat-generating part of an electronic product and a plurality of protrusions 120 extending a predetermined height from a bottom surface 110 of the fixing part 105; a cover 200 that covers the upper part of the heat sink 100 while exposing both ends of the heat sink 100 to define fluid inlet and outlet channels between the protrusions 120; at least one electric wire 300 disposed between one of the protrusions 120 and another adjacent protrusion 120 such that the electric wire 300 extends a predetermined length from one end of the heat sink 100 to the other end of the heat sink 100 while being in parallel with the protrusions 120, the electric wire 300 being made of a conductive material; an electric wire-supporting member 400 that supports both ends of the electric wire 300; and a power supply 500 that connects a high-voltage terminal to the electric wire 300 and connects a ground terminal to the heat sink 100 to supply high voltage to the electric wire 300.

In addition, the cooling device according to the present invention may further comprise: wind guides 600 formed at both sides of the respective protrusions 120 for accelerating ion wind generated by means of the electric wire 300 toward the bottom surface of the heat sink 100.

Here, the heat-generating part of the electronic product includes a printed circuit board having heat sources that generate high temperature, such as a power supply, a panel driving circuit, and a light emitting diode (LED) unit, mounted thereon, a heat sink plate, and a chassis base. Also, the heat-generating part of the electronic product may include a circuit chip, such as a central processing unit (CPU).

One of various heat sinks having different shapes of protrusions may be applied to the cooling device according to the present invention. Hereinafter, a fin-type heat sink and a pin-type heat sink, both of which are exemplary heat sinks suitably applicable to the cooling device according to the present invention, will be described in detail with reference to FIGS. 5A and 5B.

Figure 5A:
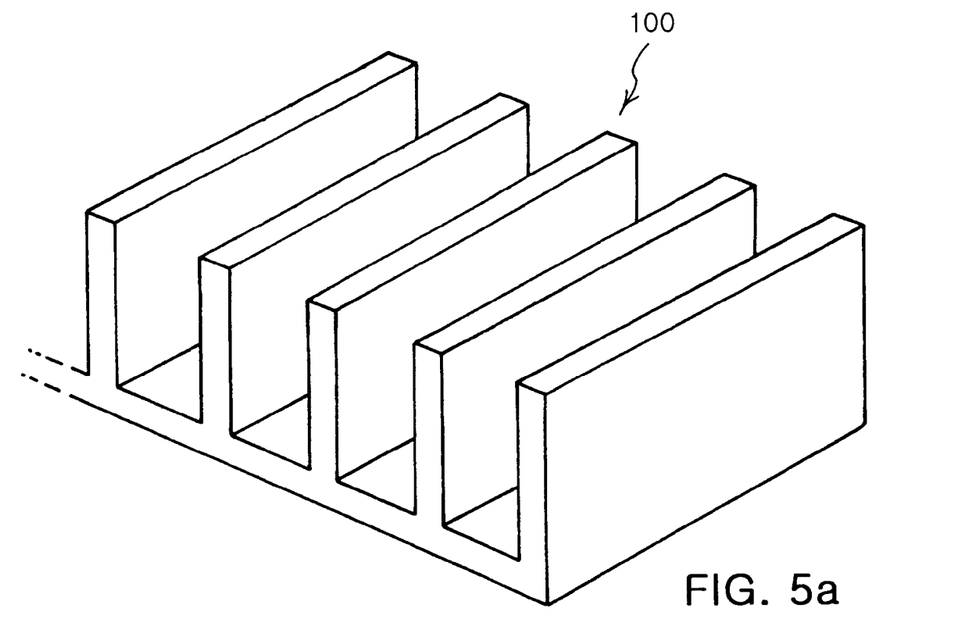
FIG. 5A is a perspective view illustrating the structure of a fin-type heat sink applicable to the present invention.

FIG. 5A is a perspective view illustrating the structure of a fin-type heat sink applicable to the present invention.

As shown in FIG. 5A, the fin-type heat sink has a plurality of protrusions. The protrusions are arranged side by side while being spaced a predetermined distance from each other. Each of the protrusions of the fin-type heat sink extends in a straight line from one end of the heat sink to the other end of the heat sink.

Figure 5B:
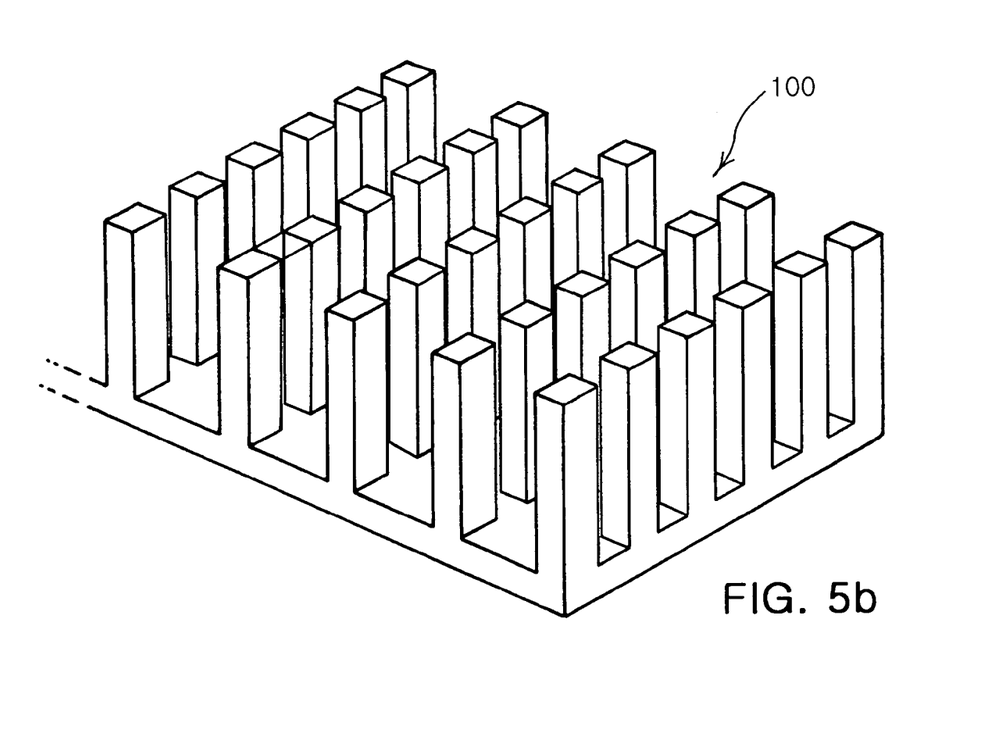
FIG. 5B is a perspective view illustrating the structure of a pin-type heat sink applicable to the present invention.

FIG. 5B is a perspective view illustrating the structure of a pin-type heat sink applicable to the present invention.

As shown in FIG. 5B, the pin-type heat sink has a plurality of square column-shaped protrusions. The protrusions are arranged in the longitudinal direction and lateral direction of the pin-type heat sink while being spaced a predetermined distance from each other. Specifically, the protrusions are arranged in a lattice structure.

It should be noted, however, that the present invention is not limited to the heat sinks as shown in FIGS. 5A and 5B, although the fin-type heat sink shown in FIG. 5A and the pin-type heat sink shown in FIG. 5B are exemplary.

Also, it should be noted that heat sinks commonly have protrusions even though they have different structures. Consequently, any one of the existing heat sinks may be applied to the cooling device according to the present invention.

Furthermore, a plurality of electric wire 300 may be disposed between the respective protrusions 120 of the heat sink 100 for increasing cooling efficiency (Refer to FIGS. 3B and 4). For example, one of the electric wires 300 may be disposed between two adjacent protrusions 120 formed at the center part of the heat sink 100 and other electric wires 300 may be disposed between all other protrusion pairs, in order to increase cooling efficiency at the center part of the heat sink 100.

In order to increase cooling efficiency of the whole heat sink 100, the electric wires 300 are preferably disposed between every two adjacent protrusions 120 of the heat sink 100. Also, the electric wires 300 are preferably arranged in the middle between every two adjacent protrusions 120 of the heat sink 100 such that the protrusions 120 can be uniformly cooled by means of ion wind generated between every two adjacent protrusions 120 of the heat sink 100.

Now, application of the electric wires 300 and the wind guides 600 to the fin-type heat sink and the pin-type heat sink will be described in detail with reference to FIGS. 6A and 6B.

Figure 6A:
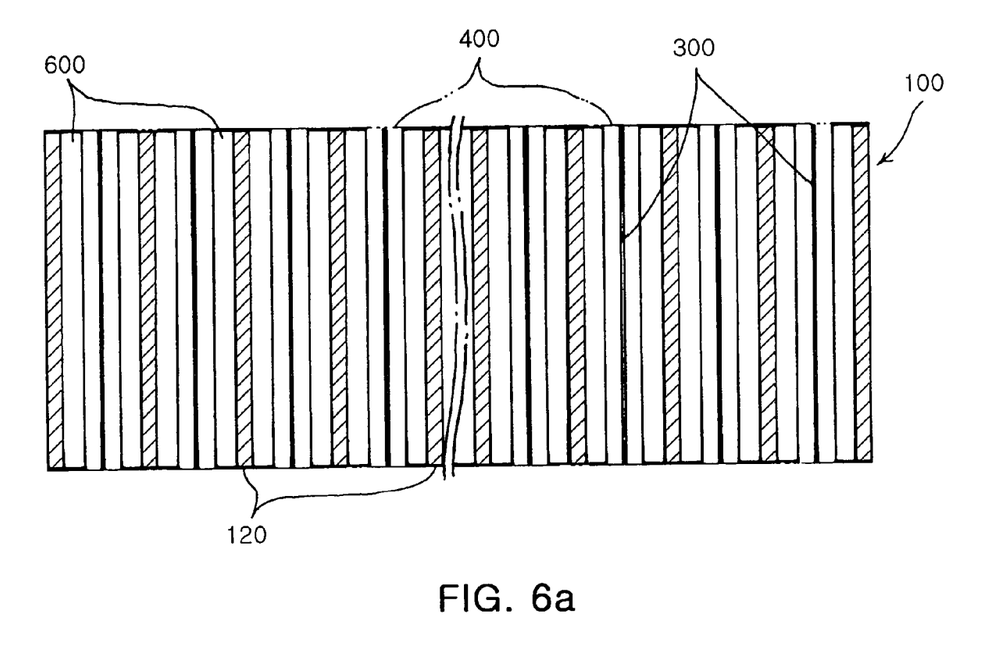
FIG. 6A is a plan view showing the fanless high-efficiency cooling device according to present invention using the fin-type heat sink shown in FIG. 5A.
Figure 6B:
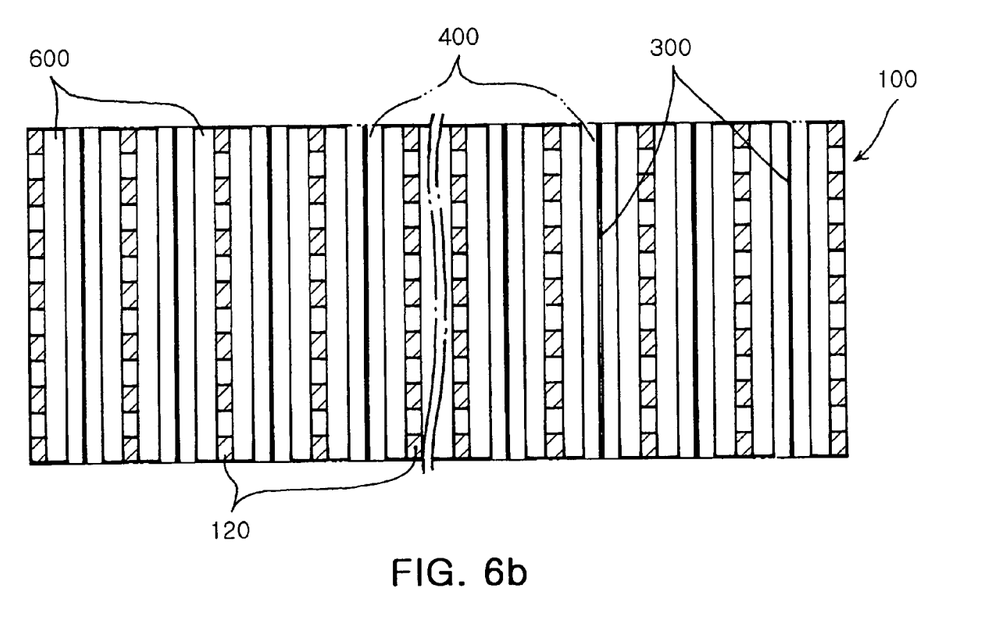
FIG. 6B is a plan view showing the fanless high-efficiency cooling device according to the present invention using the pin-type heat sink shown in FIG. 5B.

FIG. 6A is a plan view showing the fanless high-efficiency cooling device according to present invention using the fin-type heat sink shown in FIG. 5A, and FIG. 6B is a plan view showing the fanless high-efficiency cooling device according to the present invention using the pin-type heat sink shown in FIG. 5B.

When the protrusions 120 of the heat sink 100 are fin-type protrusions as shown in FIG. 6A, the electric wires 300 are arranged in the longitudinal direction of the fin-type protrusions 120. The wind guides 600 are attached to both sides of the respective fin-type protrusions 120 at a predetermined height while extending along the respective protrusions 120.

When the protrusions 120 of the heat sink 100 are pin-type protrusions as shown in FIG. 6B, the electric wires 300 are arranged in the same direction as the pin-type protrusions 120 disposed in line in the lateral direction of the heat sink 100. The wind guides 600 are attached to both sides of the respective pin-type protrusions 120 at a predetermined height while extending along the pin-type protrusions 120 disposed in line in the lateral direction of the heat sink 100.

The fin-type heat sink shown in FIG. 6A or the pin-type heat sink shown in FIG. 6B is suitably applicable to the cooling device according to the present invention.

Figure 7:
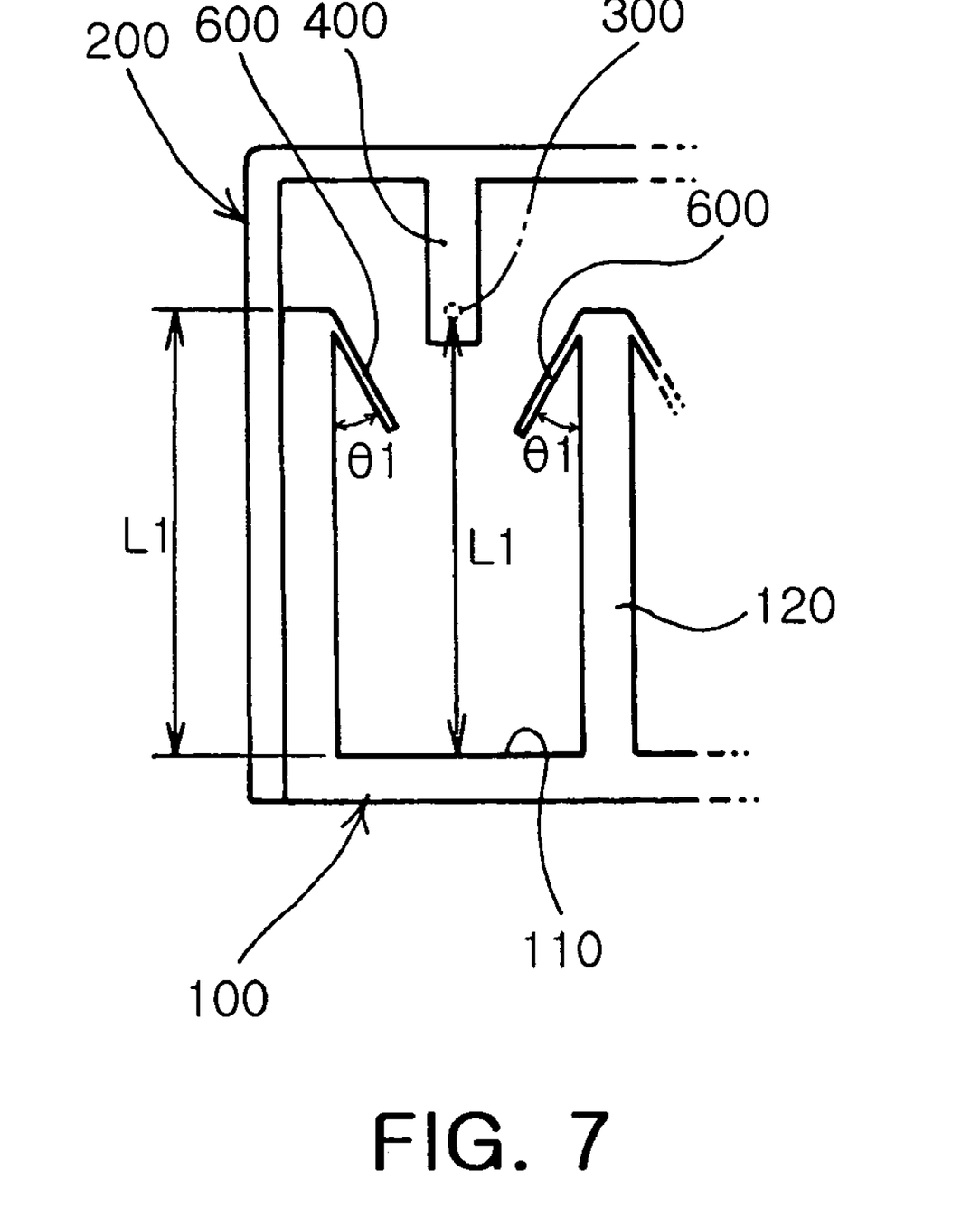
FIG. 7 is an enlarged view showing part "A" of FIG. 4.

FIG. 7 is an enlarged view showing part "A" of FIG. 4.

Referring to FIG. 7, the electric wire 300 is supported by means of the electric wire-supporting member 400 attached to the cover 200. Preferably, the electric wire 300 is disposed in the middle between two adjacent protrusions 120. In this case, the two adjacent protrusions 120 are uniformly cooled by means of ion wind generated by means of the electric wire 300 disposed between the two adjacent protrusions 120. Also, the cooled length of the sides of the protrusions 120 is maximized. Preferably, the electric wire 300 is disposed at the height L1 from the bottom surface 110 of the heat sink 100.

Preferably, a plurality of electric wire-supporting members 400 are attached to the cover 200 between the respective protrusions 120 of the heat sink 100 such that both ends of the electric wires 300 can be supported by the electric wire-supporting members 400, respectively.

Referring to FIGS. 3B, 4, and 7, the wind guides 600 are formed at the sides of the protrusions 120 of the heat sink 100 at a height less than the height L1 at which each of the electric wires 300 is disposed from the bottom surface 110 of the heat sink 100. Preferably, the wind guides 600 are formed at the sides of the protrusions 120 of the heat sink 100 at the same height as the height L1 at which each of the electric wires 300 is disposed from the bottom surface 110 of the heat sink 100. In this case, ion wind is accelerated by means of the wind guides immediately when the ion wind is generated, whereby the moving amount and the velocity of the moving ion wind are increased.

Here, the principle of ion wind acceleration is based on Bernoulli's theorem that the pressure of a fluid flowing through a decreased sectional area is decreased while the velocity of the fluid is increased.

Each of the wind guides 600 is preferably disposed such that an acute angle $\theta 1$ is defined between each of the wind guides 600 and one side of each of the protrusions 120 of the heat sink 100. For example, the acute angle defined between each of the wind guides 600 and one side of each of the protrusions 120 of the heat sink 100 is approximately 60 degrees.

Now, the operation and effect of the fanless high-efficiency cooling device according to the present invention will be described in detail with reference to the accompanying drawings.

With the fanless high-efficiency cooling device according to the present invention, heat around the heat sink 100 is effectively eliminated through forced convection of ion wind. Ion wind is a phenomenon occurring when negative corona is discharged.

When high voltage from the power supply 500 is applied to the electric wires 300, ion wind is generated from the electric wires 300 disposed between the protrusions 120 of the heat sink 100 (Refer to FIGS. 3 and 4).

The principle of ion wind generation will be briefly described as follows: When high voltage is applied to the electric wire while the heat sink 100 is grounded, a high-intensity electric field is generated at the electric wire. In the case that the potential difference of the electric field exceeds a predetermined value, a corona discharge area is created around the electric wire. Electrons in the corona discharge area are accelerated at high speed to collide with air molecules. As a result, the air molecules are divided into positive ions and electrons.

In this way, dense clouds of the positive ions and the electrons, which are called "corona discharge", are created around the electric wire. At this time, the positive ions in the corona discharge area are transmitted to the electric wire where the positive ions are absorbed, since the electric wire is a negative pole. As the electrons become more distant from the electric wire, ion wind is generated. The generated ion wind flows to the bottom surface of the heat sink between the protrusions.

Figure 8A:
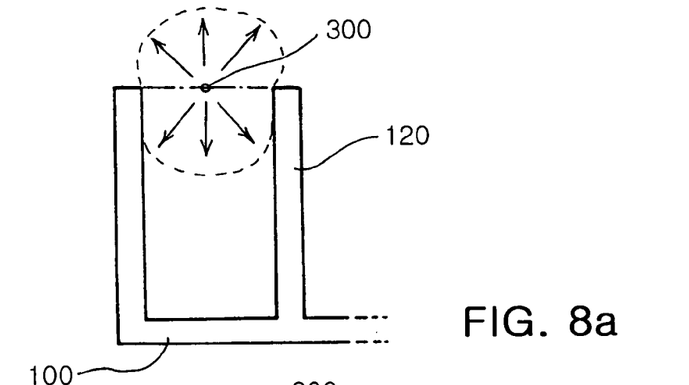
FIGS. 8A, 8B, and 8C are views illustrating the principle of ion wind acceleration according to the present invention.
Figure 8B:
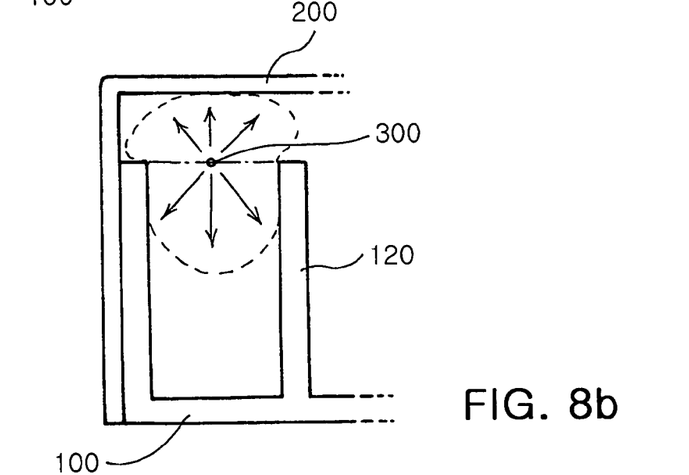
Figure 8C:
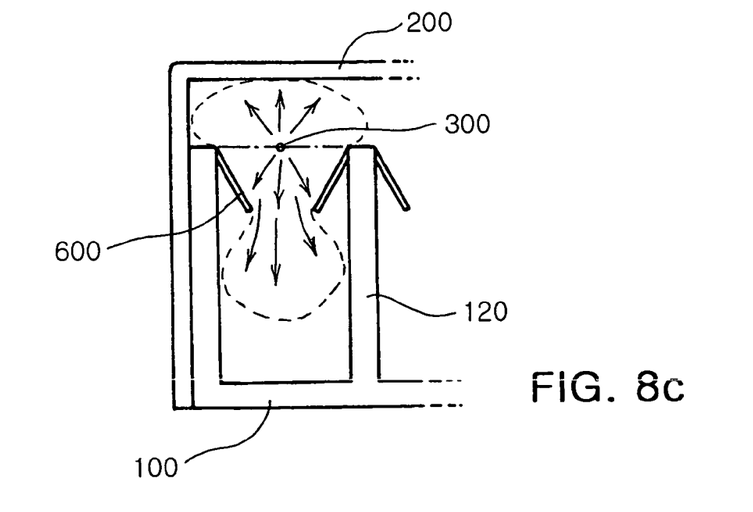

FIGS. 8A, 8B, and 8C are views illustrating the principle of ion wind acceleration according to the present invention.

Referring to FIG. 8A, the ion wind is generated from the electric wire 300 in the case that the cover 200 is removed from the heat sink 100. As can be seen from FIG. 8A, the ion wind is generated only around the electric wire 300.

Referring to FIG. 5B, the ion wind is generated from the electric wire 300 in the case that the cover 200 is disposed on the heat sink 100. As can be seen from FIG. 8B, the ion wind is concentrated between the protrusions 120 of the heat sink 100 by means of the cover 200.

Referring to FIG. 8C, the ion wind is generated from the electric wire 300 in the case that the cover 200 is disposed on the heat sink 100. As can be seen from FIG. 8C, the ion wind is concentrated between the protrusions 120 of the heat sink 100 by means of the cover 200, and the concentrated ion wind is acceleratedly moved to the bottom surface 110 of the heat sink 100.

Figure 9A:
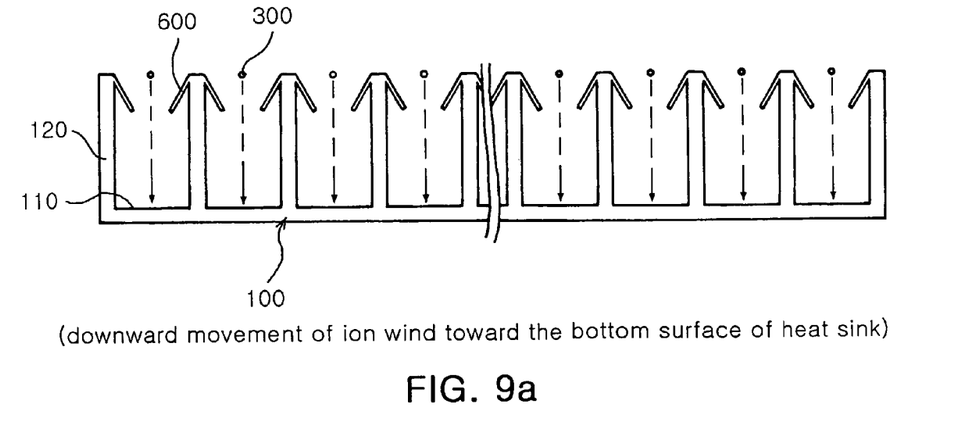
FIG. 9A is a view illustrating downward movement of the ion wind according to the present invention.
Figure 9B:
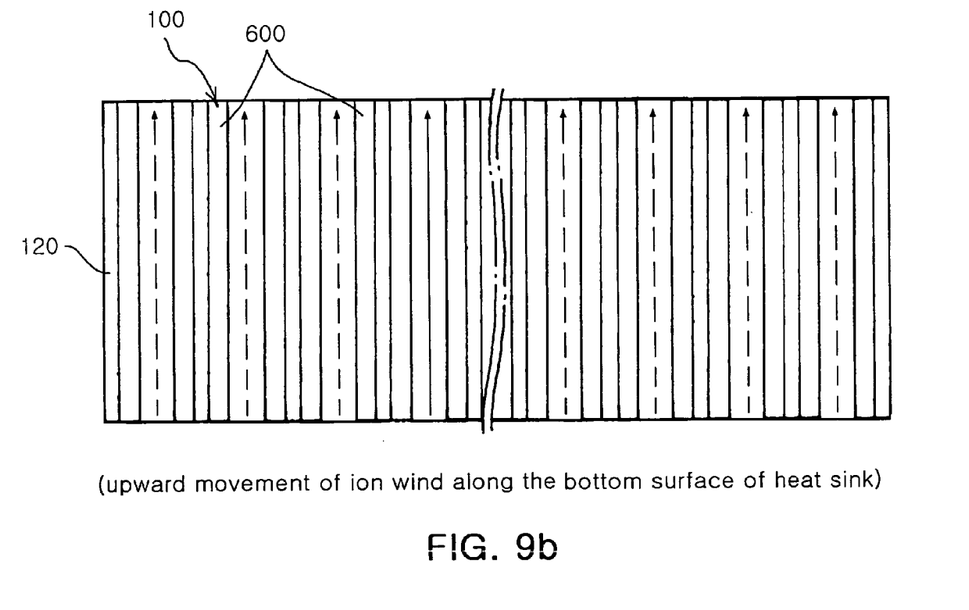
FIG. 9B is a view illustrating upward movement of the ion wind according to the present invention.

FIG. 9A is a view illustrating downward movement of the ion wind according to the present invention, and FIG. 9B is a view illustrating upward movement of the ion wind according to the present invention.

As shown in FIG. 9A, the ion wind generated from the electric wires 300 moves toward the bottom surface 110 of the heat sink 100 between the protrusions 120. The protrusions 120 are cooled by forced convection of the ion wind, whereby the temperature of the protrusions 120 is decreased.

In the case that the heat sink 100 is mounted in an electronic product such that the bottom surface 110 of the heat sink 100 is vertically disposed, and thus the protrusions 120 extend vertically along the bottom surface 110 of the heat sink 100 as shown in FIG. 9B, cool air transmitted to the bottom surface 110 of the heat sink 100 moves upward along the bottom surface 110 of the heat sink 100 by natural convection. As a result, the bottom surface of the heat sink is cooled, whereby the temperature of the bottom surface 110 of the heat sink 100 is decreased.

As described above, the heat sink is effectively cooled by the forced convection and natural convection of the ion wind.

Figure 10:
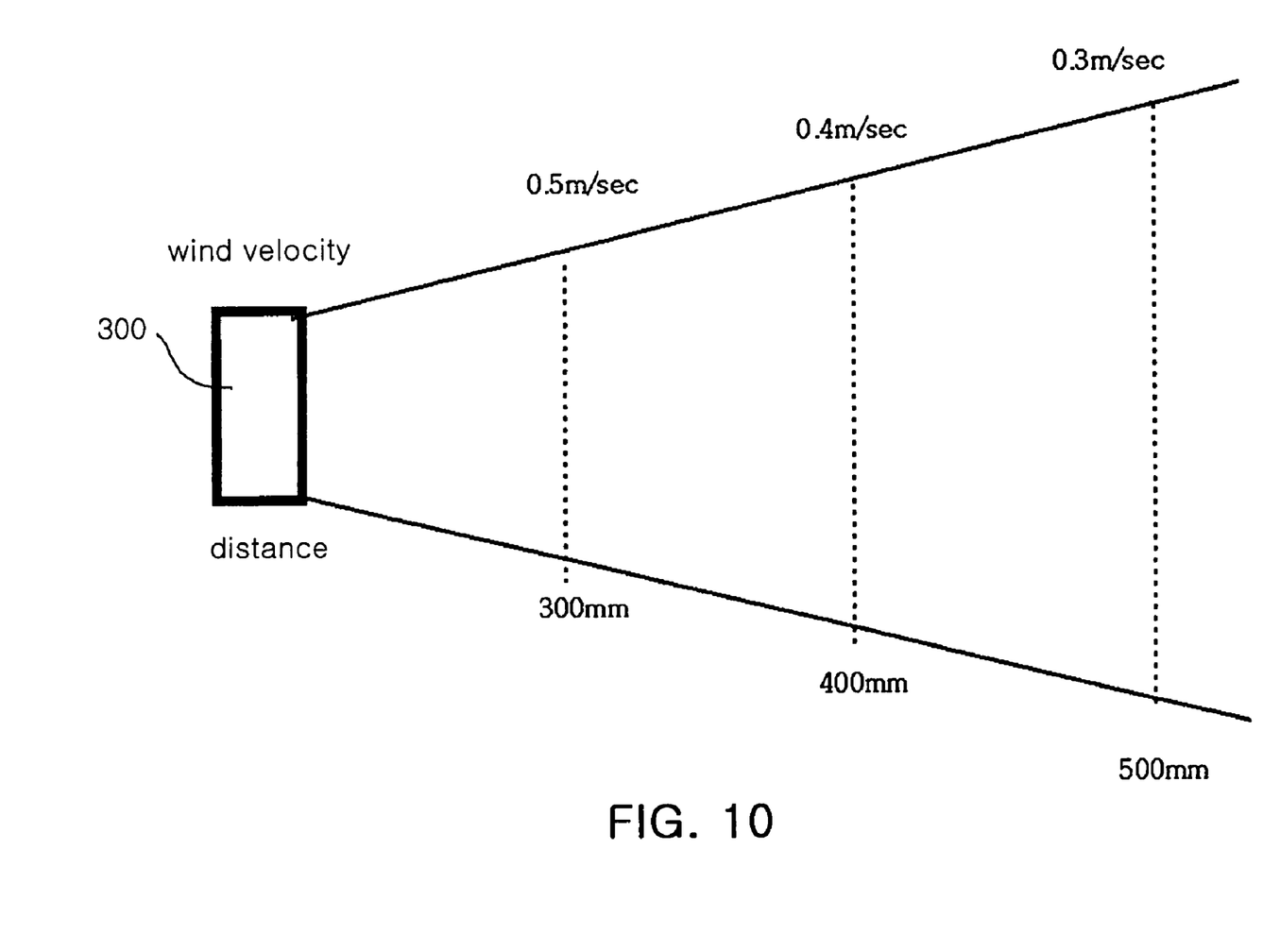
FIG. 10 is a graph illustrating velocities of the ion wind according to the present invention by distance.

FIG. 10 is a graph illustrating velocities of the ion wind according to the present invention by distance.

When a power source having 14 KV DC and 14 to 15 μA is inputted, the velocity of the ion wind is 0.5 m/sec at a distance of 300 mm, 0.4 m/sec at a distance of 400 mm, and 0.3 m/sec at a distance of 500 mm.

Figure 11A:
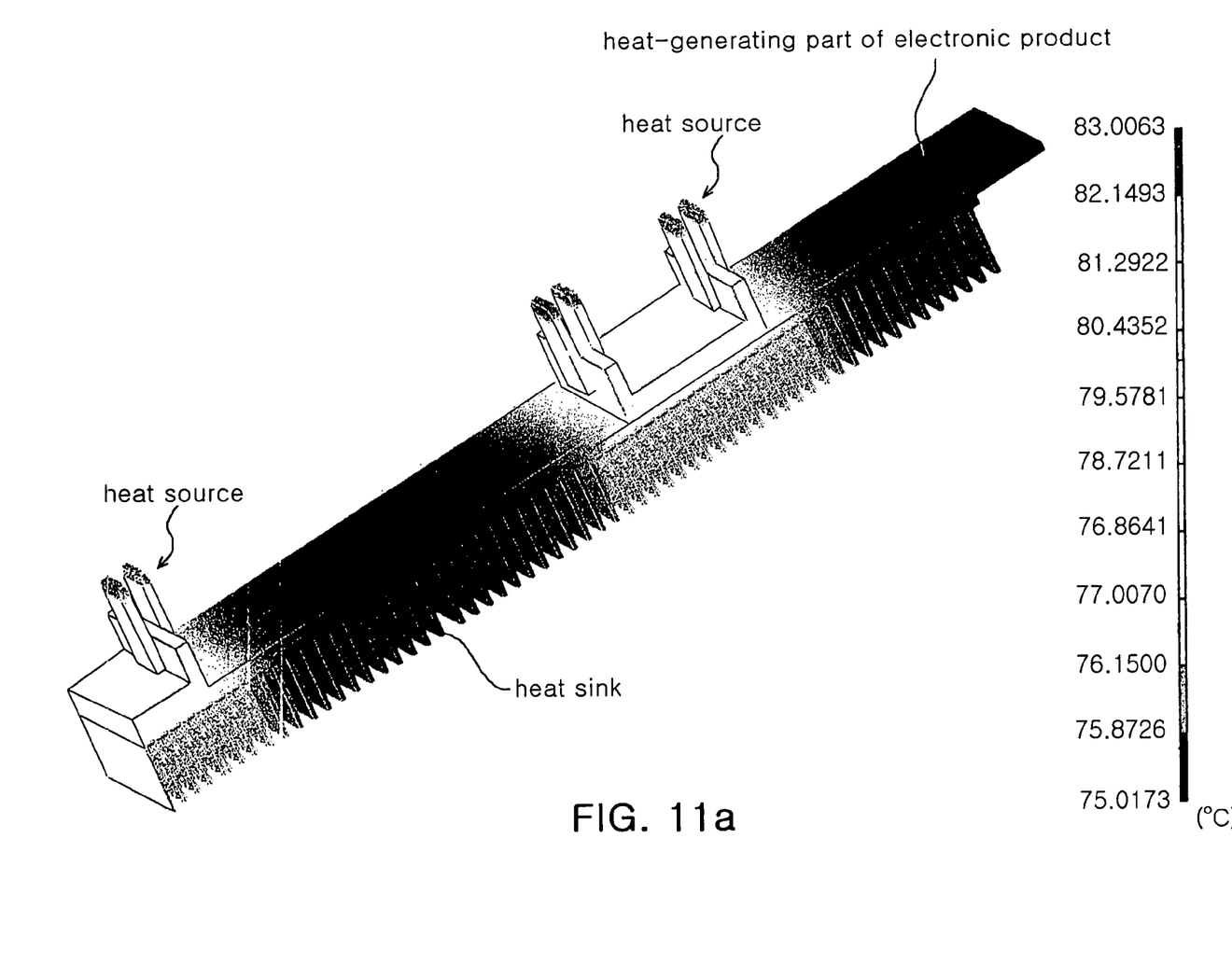
FIG. 11A is a view illustrating temperature distribution of an electronic product with the conventional cooling device mounted therein.
Figure 11B:
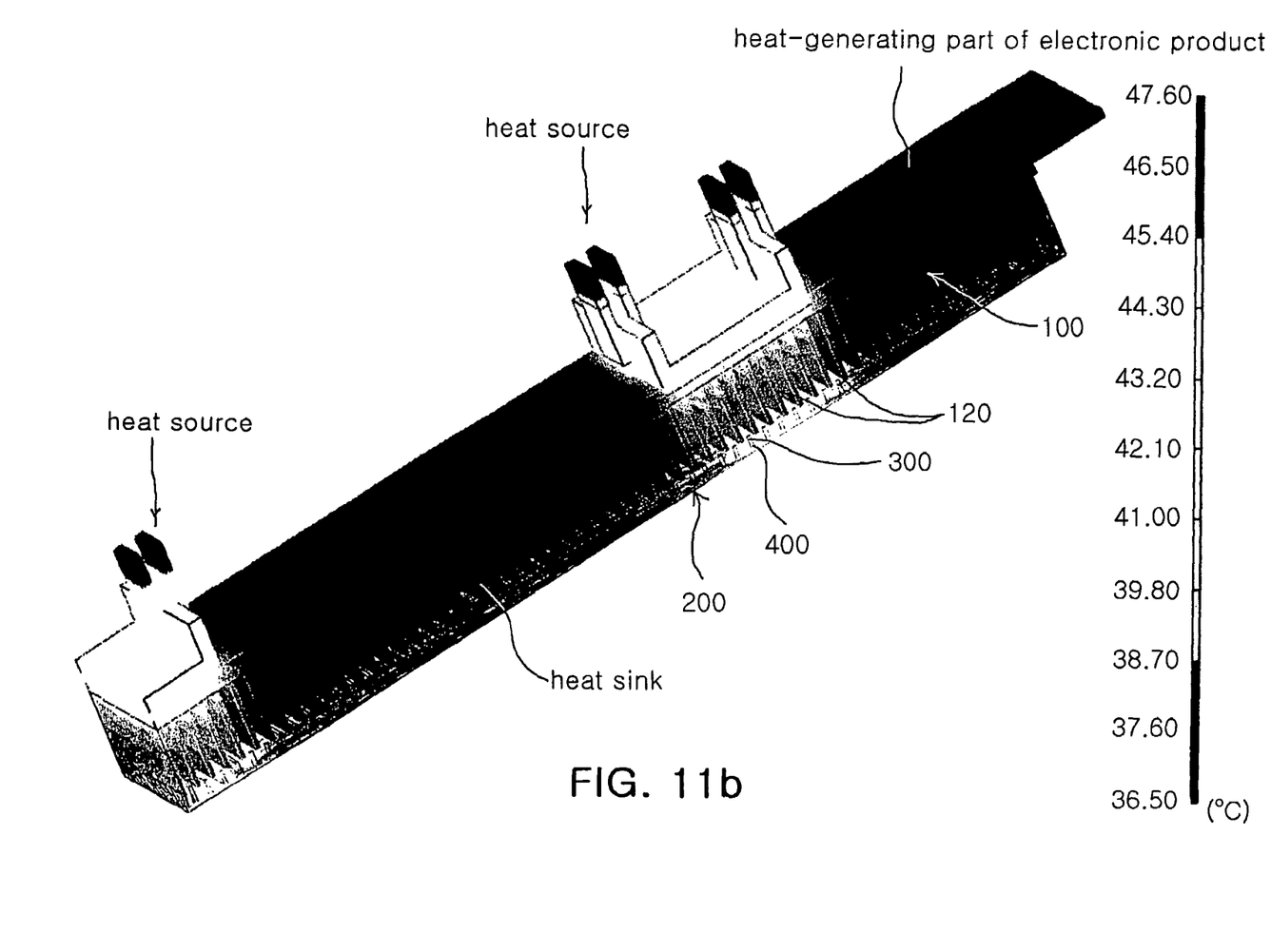
FIG. 11B is a view illustrating temperature distribution of an electronic product with the cooling device according to the present invention mounted therein.

FIG. 11A is a view illustrating temperature distribution of an electronic product with the conventional cooling device mounted therein, and FIG. 11B is a view illustrating temperature distribution of an electronic product with the cooling device according to the present invention mounted therein.

Referring to FIG. 11A, the maximum temperature of an electronic product with the conventional cooling device mounted therein is approximately 83° C. On the other hand, the maximum temperature of an electronic product with the cooling device according to the present invention mounted therein is approximately 46° C., as shown in FIG. 11B. Consequently, it can be seen that the cooling device according to the present invention has much better cooling efficiency than the conventional cooling device.

As described above, the electric wires are disposed in the middles between the protrusions of the heat sink, respectively, and high voltage (15 kV or more) is applied to each of the electric wires, so that the temperature between the protrusions of the heat sink is sufficiently decreased. Also, the wind guides are fixedly attached to the sides of the protrusions at the same height as the upper end of each of the protrusions of the heat sink while each of the wind guides is disposed at an angle of approximately 60 degrees to the corresponding side of each of the protrusions of the heat sink. The ion wind is accelerated by means of the wind guides, whereby cooling efficiency of the cooling device according to the present invention is further improved.

As apparent from the above description, the present invention provides a fanless high-efficiency cooling device that is applicable to electronic products having heat sources, such as plasma display panel (PDP) televisions, liquid crystal display (LCD) televisions, and liquid crystal display (LCD) monitors. The fanless high-efficiency cooling device according to the present invention directly supplies ion wind between protrusions of a heat sink through forced convection of ion wind. Consequently, the present invention has the effect of minimizing the remaining temperature of the heat sink, and thus effectively decreasing the temperature of a heat-generating part of an electronic product with the cooling device according to the present invention mounted therein. Heat generated from the electronic product is noiselessly eliminated by means of the cooling device according to the present invention without using a cooling fan. Consequently, the electronic product with the cooling device according to the present invention mounted therein is quietly operated.

Also, the velocity of the ion wind is increased. Consequently, cooling efficiency of the fanless high-efficiency cooling device is improved.

Furthermore, the thickness of the heat sink is reduced, whereby the thickness of the electronic product with the cooling device according to the present invention mounted therein is minimized.

In addition, power consumption is decreased, and the reliability of the cooling device according to the present invention is improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A fanless high-efficiency cooling device using ion wind, the device comprising:
   a heat sink having a fixing part fixedly attached to a heat-generating part of an electronic product and a plurality of protrusions extending a predetermined height from a bottom surface of the fixing part;
   a cover that covers the upper part of the heat sink while exposing both ends of the heat sink to define fluid inlet and outlet channels between the protrusions;
   at least one electric wire, disposed between one of the protrusions and another adjacent protrusion such that the electric wire extends a predetermined length from one end of the heat sink to the other end of the heat sink while being in parallel with the protrusions, for generating ion wind between the corresponding protrusions when high voltage is applied to the electric wire, the electric wire being made of a conductive material;
   an electric wire-supporting member that supports both ends of the electric wire; and
   a power supply that connects a high-voltage terminal to the electric wire and connects a ground terminal to the heat sink to supply high voltage to the electric wire.

2. The device as set forth in claim 1, further comprising:
wind guides formed at both sides of the respective protrusions for accelerating ion wind generated by means of the electric wire toward the bottom surface of the heat sink.

3. The device as set forth in claim 1, wherein the electric wire-supporting member is attached to the cover between the protrusions of the heat sink such that both ends of the electric wire can be supported by the electric wire-supporting member.

4. The device as set forth in claim 1, wherein the electric wire is arranged in the middle between the two adjacent protrusions of the heat sink.

5. The device as set forth in claim 1, wherein the electric wire is arranged in the middle between the upper ends of the two adjacent protrusions of the heat sink.

6. The device as set forth in claim 1, wherein the electric wire is arranged in the longitudinal direction of the protrusions of the heat sink when the protrusions of the heat sink are fin-type protrusions.

7. The device as set forth in claim 1, wherein the electric wire is arranged in the same direction as the protrusions disposed in line in the lateral direction of the heat sink when the protrusions of the heat sink are pin-type protrusions.

8. The device as set forth in claim 2, wherein the wind guides are formed at the sides of the protrusions of the heat sink at the same height as the disposition height of the electric wire from the bottom surface of the heat sink.

9. The device as set forth in claim 2, wherein the wind guides are formed at the sides of the protrusions of the heat sink at a height less than the disposition height of the electric wire from the bottom surface of the heat sink.

10. The device as set forth in claim 2, wherein the wind guides are disposed such that an acute angle is defined between each of the wind guides and one side of each of the protrusions of the heat sink.

11. The device as set forth in claim 10, wherein the acute angle defined between each of the wind guides and one side of each of the protrusions of the heat sink is approximately 60 degrees.

* * * * *